United States Patent
Naone

(10) Patent No.: US 6,810,065 B1
(45) Date of Patent: Oct. 26, 2004

(54) LOW ELECTRICAL RESISTANCE N-TYPE MIRROR FOR OPTOELECTRONIC DEVICES

(75) Inventor: Ryan Likeke Naone, Boulder, CO (US)

(73) Assignee: Optical Communication Productions, Inc., Woodland Hills, CA (US)

(*) Notice: Subject to any disclaimer, the term of this patent is extended or adjusted under 35 U.S.C. 154(b) by 318 days.

(21) Appl. No.: 09/996,009

(22) Filed: Nov. 28, 2001

Related U.S. Application Data

(60) Provisional application No. 60/283,449, filed on Apr. 11, 2001, and provisional application No. 60/253,497, filed on Nov. 28, 2000.

(51) Int. Cl.[7] .............................................. H01S 5/183
(52) U.S. Cl. .............................. 372/96; 372/45; 372/99
(58) Field of Search ............................... 372/96, 99, 45

(56) References Cited

U.S. PATENT DOCUMENTS

| | | |
|---|---|---|
| 4,908,686 A | 3/1990 | Maserjian |
| 5,245,622 A | 9/1993 | Jewell et al. .................. 372/45 |
| 5,424,559 A | 6/1995 | Kasahara |
| 5,557,627 A | 9/1996 | Schneider, Jr. et al. |
| 5,936,266 A | 8/1999 | Holonyak, Jr. et al. ..... 257/106 |
| 5,960,018 A | 9/1999 | Jewell et al. |
| 5,978,398 A * | 11/1999 | Ramdani et al. ............... 372/45 |
| 6,052,398 A | 4/2000 | Brillouet et al. |
| 6,061,380 A * | 5/2000 | Jiang et al. .................... 372/96 |
| 6,618,410 B1 * | 9/2003 | Fischer et al. ................ 372/45 |
| 2001/0050934 A1 | 12/2001 | Choquette et al. ............. 372/43 |

OTHER PUBLICATIONS

Winston et al., *Optoelectronic Device Simulation of Bragg Reflectors and Their Influence on Surface Emitting Laser Characteristics*. Department of Electrical and Computer Engineering and the Optoelectronic Computing Systems Center University of Colorado, Boulder, CO, 80309–0–125, pp. 1–17 and 22–34 (No Date).

Schneider. Jr. et al., *Epitaxy of Vertical–Cavity Lasers*, In Vertical–Cavity Surface–Emitting Lasers, edited by C. Wilmsen, H. Tenkin, and L. Coldren, 1999, pp. 137–139, Cambridge, UK: Cambridge University Press (No Month).

* cited by examiner

Primary Examiner—James Davie
(74) Attorney, Agent, or Firm—Barlow, Josephs & Holmes, Ltd.

(57) ABSTRACT

An optoelectronic device having one or more DBR mirrors having a low voltage drop across the mirror layers and a high reflectivity for emission at a nominal wavelength of 1300 nm below, at and above room temperature. The low resistance DBR may be used as a top output mirror of a tunnel junction VCSEL that reduces resistance and optical losses by reducing the amount of p-type material within the device.

36 Claims, 15 Drawing Sheets

LOW ELECTRICAL RESISTANCE N-TYPE MIRROR FOR OPTOELECTRONIC DEVICES

CROSS-REFERENCE TO RELATED APPLICATIONS

This application claims priority to U.S. Provisional Patent application Ser. No. 60/253,497, entitled "LOW ELECTRICAL RESISTANCE N-TYPE MIRROR" filed on Nov. 28, 2000 and U.S. Provisional Patent application Ser. No. 60/283,449, filed on Apr. 11, 2001, entitled "LONG WAVELENGTH VERTICAL CAVITY SURFACE EMITTING LASER" the contents of both of which are incorporated herein by reference.

This application contains subject matter that is related to co-pending patent application Ser. No. 10/122,707, filed Apr. 11, 2002.

FIELD OF THE INVENTION

The present invention generally relates to optoelectronic devices and more particularly relates to low resistance optoelectronic devices.

BACKGROUND

Vertical cavity surface emitting lasers (VCSELs) have been widely and rapidly adopted into Gigabit Ethernet and other applications. VCSELs are particularly suitable for multi-mode optical fiber local area networks due to their reliability, reduced threshold current, circular output beam, and inexpensive and high volume manufacture. In addition single mode lasers have advantages in terms of high speed data transmission due to the well defined rise and fall time of the single optical mode.

A principal characteristic of a VCSEL is that it emits beams vertically, i.e. in a direction normal to the p-n junction of the semiconductor wafer from which it was fabricated. Historically, VCSELs have been fabricated using crystalline growth techniques to deposit many layers of semiconductor material upon a substrate. These lasers include highly reflective surfaces above and below an active layer, forming a laser cavity perpendicular to the active layer plane. In III–V semiconductor light emitting devices, the active region is typically disposed between n-type and p-type semiconductor regions. Upon application of an electrical potential, holes enter the active region from the p-type semiconductor material and recombine with electrons that enter the active region from the n-type semiconductor material, and photons are emitted.

Conventional VCSEL designs utilize a thin active region, typically on the order of one wavelength of the emitted light, to achieve a low threshold current as well as longitudinal (or axial) mode control. However, thin active regions typically have a single pass optical gain of approximately 1%, so that upper and lower mirrors having reflectivities greater than about 99% are required to achieve lasing. Conventional VCSEL designs often utilize semiconductor distributed Bragg reflectors (DBRs) to achieve the required reflectivity. DBRs provide the necessary reflectivity but have the disadvantage of being highly resistive and in operation may cause significant levels of self heating.

Due to its relatively small current carrying volume, heating in VCSELs is an important issue. For example, the operating performance of a VCSEL (slope efficiency and threshold) typically varies as a function of temperature. In addition, long term laser reliability may also be compromised in high resistivity devices.

VCSEL heating may be further exaggerated in designs that incorporate current constriction techniques such as, for example, mesas, oxide apertures or ion implantations in the upper mirror for single transverse mode operation. Current constrictions confine the current flowing in the upper mirror of these designs so that the current density in the constricted region is orders of magnitude higher than in the bottom or un-constricted mirror. Thus, the majority of the voltage drop and heat generation occurs in the top or constricted mirror.

Conventional VCSEL structures frequently have a p-type upper DBR that uses holes as the majority current carrying species. Therefore, previous attempts to lower the electrical resistance of mirrors have primarily focused on the p-type DBR. However, in the AlGaAs system, the minimum in the valence energy band for p-type material varies in a smooth almost linear fashion in accordance with the aluminum composition within the material. It is therefore a relatively straightforward matter to design low resistance p-type DBRs.

However, p-type material is more difficult to work with than n-type material, especially for VCSELs that emit at long wavelengths, such as in the 1.2 to 1.6 $\mu$m regime. The p-type material tends to be operationally inferior to corresponding n-type material with regard to carrier mobility, overall electrical efficiency, and free carrier optical absorption at these wavelengths. Therefore, long wavelength VCSEL designs typically reduce or eliminate the use of p-type mirror layers to minimize optical loss through the p-type material.

SUMMARY OF THE INVENTION

In one aspect of the present an optoelectronic device includes an active region sandwiched between an upper mirror and a lower mirror, wherein at least one of the upper and lower mirrors is formed from alternating layers of high index and low index of refraction semiconductor material with a step graded interfacial transition layer there between.

In a further aspect of the present invention an optoelectronic device includes an active region sandwiched between a first mirror and a second mirror, wherein the second mirror comprises a plurality of mirror periods formed from alternating layers of a first material having a first index of refraction and a second material having a second refraction with an interfacial transition layer between the first and second materials and a tunnel junction formed in said second mirror for injecting holes into said active region.

In another aspect of the present invention an optical subassembly includes an electrical package containing a VCSEL having at least one mirror comprised of a plurality of mirror periods wherein at least a portion of the mirror periods are formed from alternating layers of a first material having a first index of refraction and a second material having a second index of refraction. The electrical package may further include a photodetector for monitoring power of the VCSEL. In addition, a housing may be attached to the electrical package, the housing including a ferule for aligning a fiber with an optical path carrying light from the VCSEL.

BRIEF DESCRIPTION OF THE DRAWINGS

These and other features, aspects, and advantages of the present invention will become better understood with regard to the following description, appended claims, and accompanying drawings, in which:

FIG. 11 graphically illustrates the laser output power and voltage as a function of current of the VCSEL illustrated in FIG. 10;

DETAILED DESCRIPTION OF THE INVENTION

An exemplary embodiment of the present invention provides a low resistance, high reflectivity n-type mirror for integration into semiconductor optoelectronic devices. For example, the present invention is well suited for integration into optoelectronic devices that emit or receive light at a nominal wavelength of 1300 nm.

For example, long wavelength VCSELs may incorporate unipolar n-type upper and lower mirror layers to reduce the loss associated with p-type materials at long wavelengths. However, conventional n-type mirror designs comprising alternating layers of high index and low index materials may have an excessive voltage drop across the mirror due to heterojunction energy band discontinuities between adjacent layers. In practice, mirror resistance often accounts for up to 60–70% of the voltage budget for conventional VCSEL designs having unipolar n-type upper and lower mirror layers For a VCSEL, this voltage drop increases the voltage required to bias the device and produces excess heating therein, thereby deteriorating device efficiency and performance.

However, the design of a low resistance n-type DBR is complicated by the variation of the conduction energy band as a function of the aluminum composition in the material. For example, for the AlGaAs material system the minimum in the conduction energy band is also nearly linearly dependent upon the aluminum concentration for aluminum content ranging from 0% to about 44%. However, at about 44% aluminum composition the Γ-band minimum of the conduction band begins to exceed the X-band minimum.

The conduction band minimum for compositions having 44% aluminum to pure AlAs (the X-band), increases more slowly and somewhat quadratically as a function of the aluminum composition. This Γ-to-X transition impacts electron transport due to changes in the electron mobility and phonon assisted scattering that must occur in order for an electron to switch bands. In designing optimized n-type DBRs, one must take into account the Γ-to-X transition, a process that is more sophisticated than p-type DBR designs.

Figure 1:
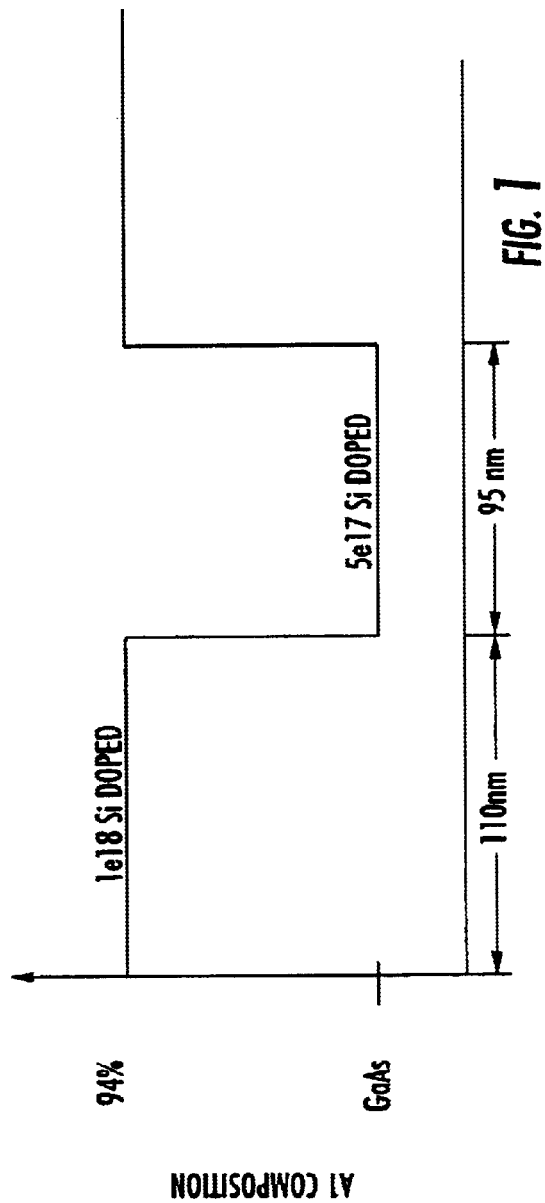
FIG. 1 graphically illustrates the composition and doping of a conventional DBR.
Figure 2:
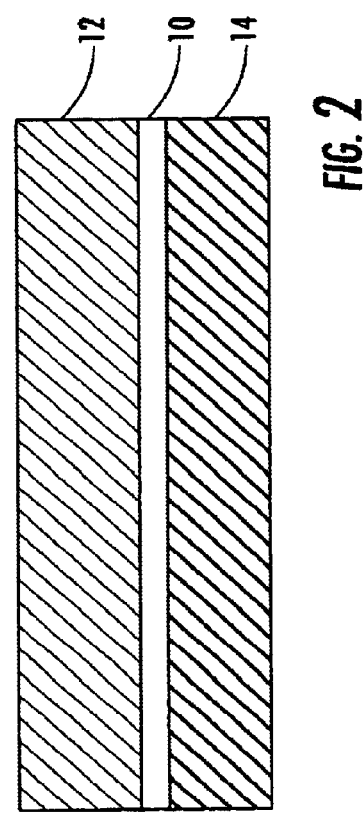
FIG. 2 is a cross-sectional view of low resistance DBR having a interfacial transition, layer between the low and high index layer pairs in accordance with an exemplary embodiment of the present invention

A conventional long wavelength n-type DBR may comprise for example alternating layers of AlGaAs/GaAs with doping concentrations as illustrated in FIG. 1. As is known in the art the thickness of the alternating layers is typically equal to one-quarter of the emission wavelength. However, conventional n-type mirror designs may have an excessive voltage drop across the mirror due to heterojunction energy band discontinuities between adjacent layers. Referring to FIG. 2, in an exemplary embodiment of the present invention, an interfacial transition layer 10 may be included between the high and low index layers 12 and 14 respectively. The interfacial transition layer reduces the heterojunction energy band discontinuities between adjacent semiconductor layers due to offsets in the conduction band, a valence band or both. The reduction in band discontinuities and Γ-to-X band matching reduces the voltage drop across the n-type mirror leading to lower power dissipation and reduced device heating.

An exemplary interfacial transition layer for the AlGaAs/GaAs material system may comprise, for example, a layer of $Al_xGa_{1-x}As$ where the aluminum composition ranges from about $0.27 < x < 0.33$ and the thickness of the interfacial layer may range from about 8–12 nm. One of skill in the art will appreciate that the aluminum composition in the alternating low and high index of refraction layers may vary in accordance with wavelength, index contrast or other operating parameters. In this instance the aluminum composition in the transition layer may vary in accordance with material composition of the alternating layers in the DBR. Therefore, the disclosed compositional ranges are by way of example and not by way of limitation.

In the described exemplary embodiment the transition layer may be doped with a suitable n-type dopant, such as for example, silicon. In an exemplary embodiment the doping level of the interfacial layer varies as a function of the average doping level in the high and low index layers. In the described exemplary embodiment the doping level is approximately 2–6 times the average doping level of the alternating high and low index layers. In accordance with an exemplary embodiment, the interfacial layer primarily affects the electrical properties of the DBR. For example, in one embodiment the thickness of the high and low index layers are each reduced 4–6 nm to accommodate the 8–12 nm interfacial transition layer and to maintain the reflectivity of the DBR.

Figure 3:
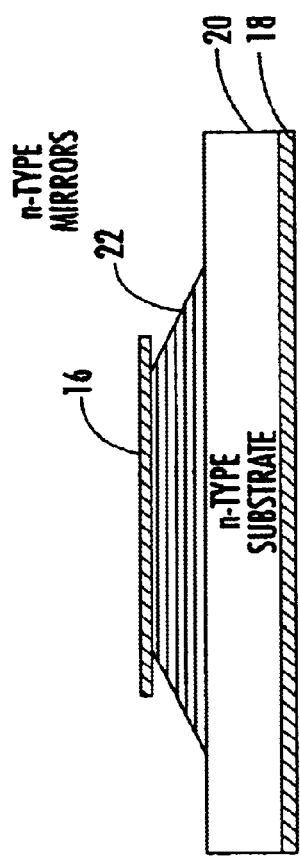
FIG. 3 is a cross-sectional view of an n-type mirror grown on a substrate for characterization of the voltage drop across the mirror layers.

Referring to FIG. 3, for purposes of illustration, a conventional n-type mirror and an exemplary low resistance n-type mirror having an interfacial transition layer were grown on n-type substrates to support performance testing at a wavelength near 1300 nm. The conventional mirror comprised fifteen pairs of alternating quarter-wavelength-thick layers of $Al_{0.94}Ga_{0.06}As$ and GaAs. The low index $Al_{0.94}Ga_{0.06}As$ layers were silicon doped with a donor concentration of $1\times10^{18}$ cm$^{-3}$. The high index GaAs layers were doped with silicon at a density of $5\times10^{17}$ cm$^{-3}$ (see FIG. 1). In addition a 10 nm GaAs cap, doped at a density of $1\times10^{19}$ cm$^{-3}$ was deposited on the uppermost mirror layer to minimize contact resistance.

Figure 4:
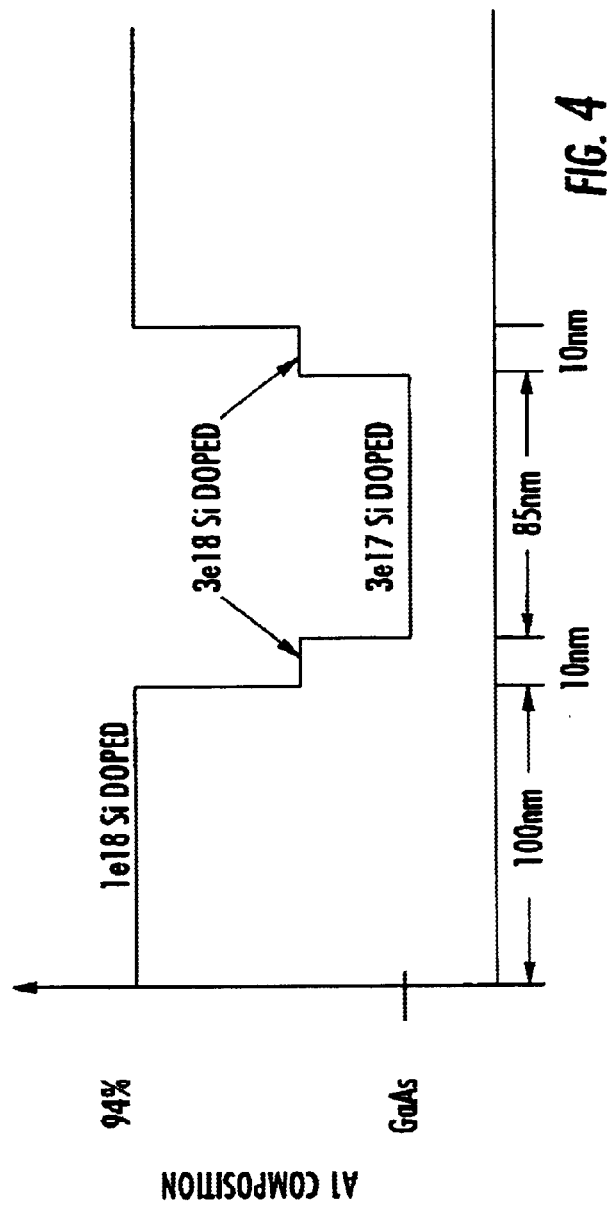
FIG. 4 graphically illustrates the composition and doping of a low resistance DBR having an interfacial transition layer between the low and high index layer pairs in accordance with an exemplary embodiment of the present invention.

The low resistance n-type mirror comprised fifteen pairs of alternating quarter-wavelength-thick layers of $Al_{0.94}Ga_{0.06}As$ and GaAs with an interfacial transition layer of $Al_{0.3}Ga_{0.7}As$ between each high and low index layer pair. In the described exemplary embodiment the low index $Al_{0.94}Ga_{0.06}As$ layers were silicon doped with a donor concentration of $1\times10^{18}$ cm$^{-3}$. Further, the high index GaAs layers were doped with silicon at a density of $3\times10^{17}$ cm$^{-3}$ and the transition layer was silicon doped with a donor concentration of approximately $3\times10^{18}$ cm$^{-3}$ (see FIG 4).

In accordance with an exemplary embodiment the thickness of the high and low index layers were each reduced by 5 nm to accommodate the 10 nm transition layers in an overall quarter six wavelength thick layer. The described exemplary low resistance n-type mirror also includes a 10 nm GaAs cap on the uppermost mirror layer, to minimize contact resistance. In the described exemplary embodiment, the GaAs cap may be doped with a suitable dopant at a density on the order of about $1\times10^{19}$ cm–3.

Referring back to FIG. 3, in the described exemplary embodiment, an upper ohmic contact 16 was formed on the GaAs cap and a lower ohmic contact 18 was formed on the substrate 20 of both the conventional n-type mirror and the low resistance mirror (mirror layers generally shown as 22). The mirror layers 22 were wet etched down to the n-type substrate 20 using the upper ohmic contact as an etch mask, to form a mesa in the mirror layers. The upper ohmic contact was slightly undercut so that the mesa was slightly smaller than the upper ohmic contact.

Figure 5:
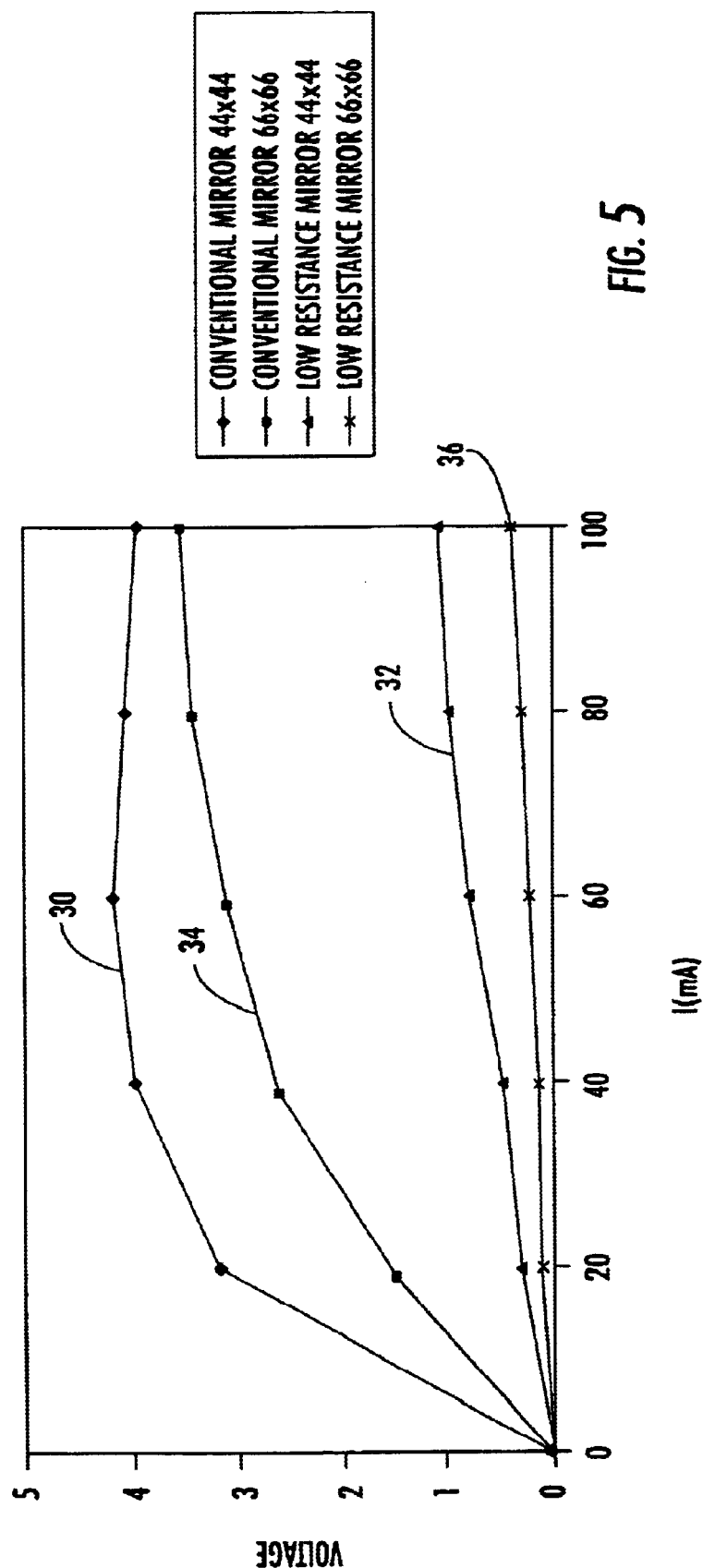
FIG. 5 graphically illustrates the current versus voltage performance for a conventional n-type DBR and a low resistance n-type DBR in accordance with an exemplary embodiment of the present invention.

Referring to FIG. 5, I–V measurements were performed on multiple size devices. For example, initial tests were performed on a conventional n-type DBR and an exemplary low resistance DBR having a 52×52 µm ohmic contact and a 44×44 µm mesa 30 and 32 respectively. Further tests were performed on a conventional n-type DBR and an exemplary low resistance DBR having a 74×74 µm upper ohmic contact and a 66×66 µm mesa (34 and 36 respectively). As compared to the conventional n-type DBR, the low electrical resistance n-type DBR, having the interfacial transition layer reduced the voltage drop across the mirror layers on the order of about 70–90% for a given drive current.

Figure 6:
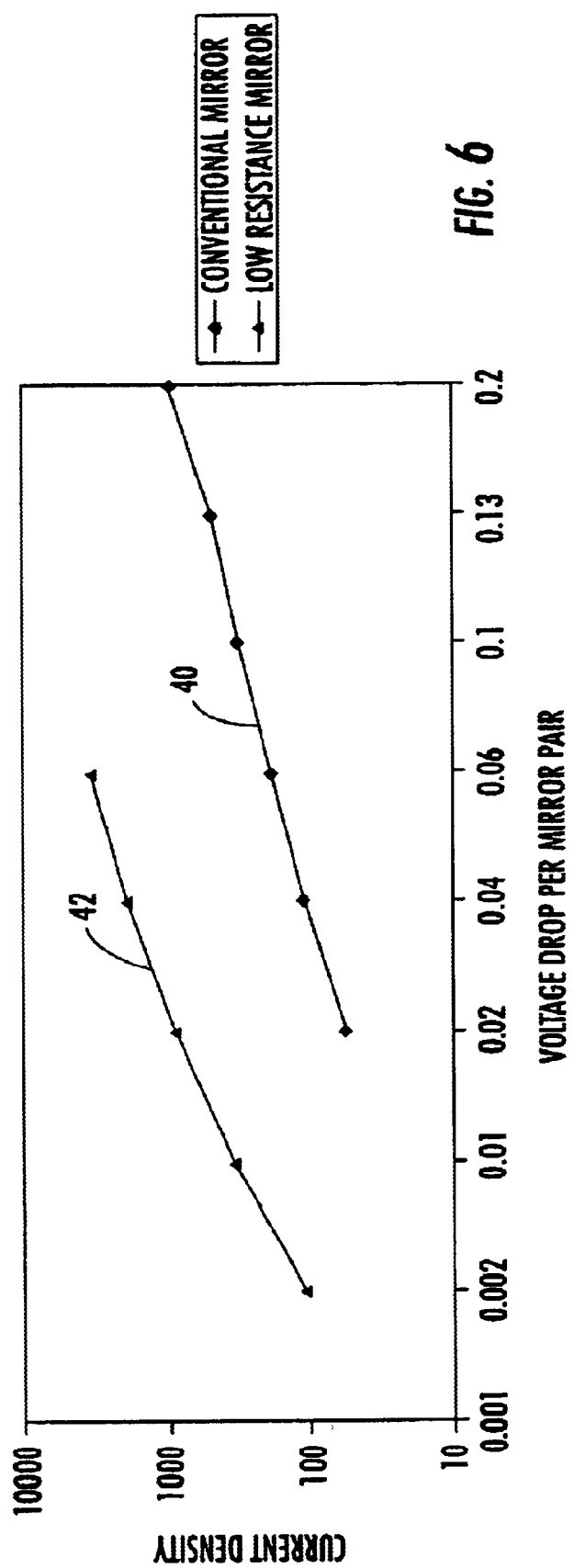
FIG. 6 graphically illustrates the current density versus voltage drop per mirror layer pair for a conventional n-type DBR and a low resistance n-type DBR in accordance with an exemplary embodiment of the present invention.

For purposes of illustration, the measured I–V data of FIG. 5 was normalized to estimate the voltage drop per mirror pair. Referring to FIG. 6, the drive current was divided by the mesa area to obtain a current density. In addition, the voltage was divided by fifteen, the number of mirror pairs to obtain the voltage drop per mirror period for a conventional n-type DBR 40 and the described exemplary n-type DBR with an interfacial transition layer 42. The voltage drop per mirror period as a function of drive current may be used to estimate the voltage drop across the mirror of a typical VCSEL.

For example, the threshold current of an exemplary long wavelength VCSEL with a 4.5 µm diameter aperture is on the order of about 1.95 mA. Further, assuming that a mesa structure in an upper mirror of an exemplary VCSEL is on the order of about 20×20 µm, the estimated current density for a typical long wavelength VCSEL is on the order of about $4.9\times10^2$ A/cm$^2$.

The voltage drop across each period of the conventional n-type DBR at a current density of about $4.9\times10^2$ A/cm$^2$ is approximately 0.13 volts. Thus the voltage drop across, a twenty eight period conventional n-type DBR is on the order of about 3.6 volts. However, the corresponding voltage drop across each period of the described exemplary low resistance n-type DBR at a current density of about $4.9\times10^2$ A/cm$^2$ is on the order of about 0.011 volts. Therefore, the total voltage drop for a 28 mirror pair structure is on the order of about 0.3 volts.

Figure 7:
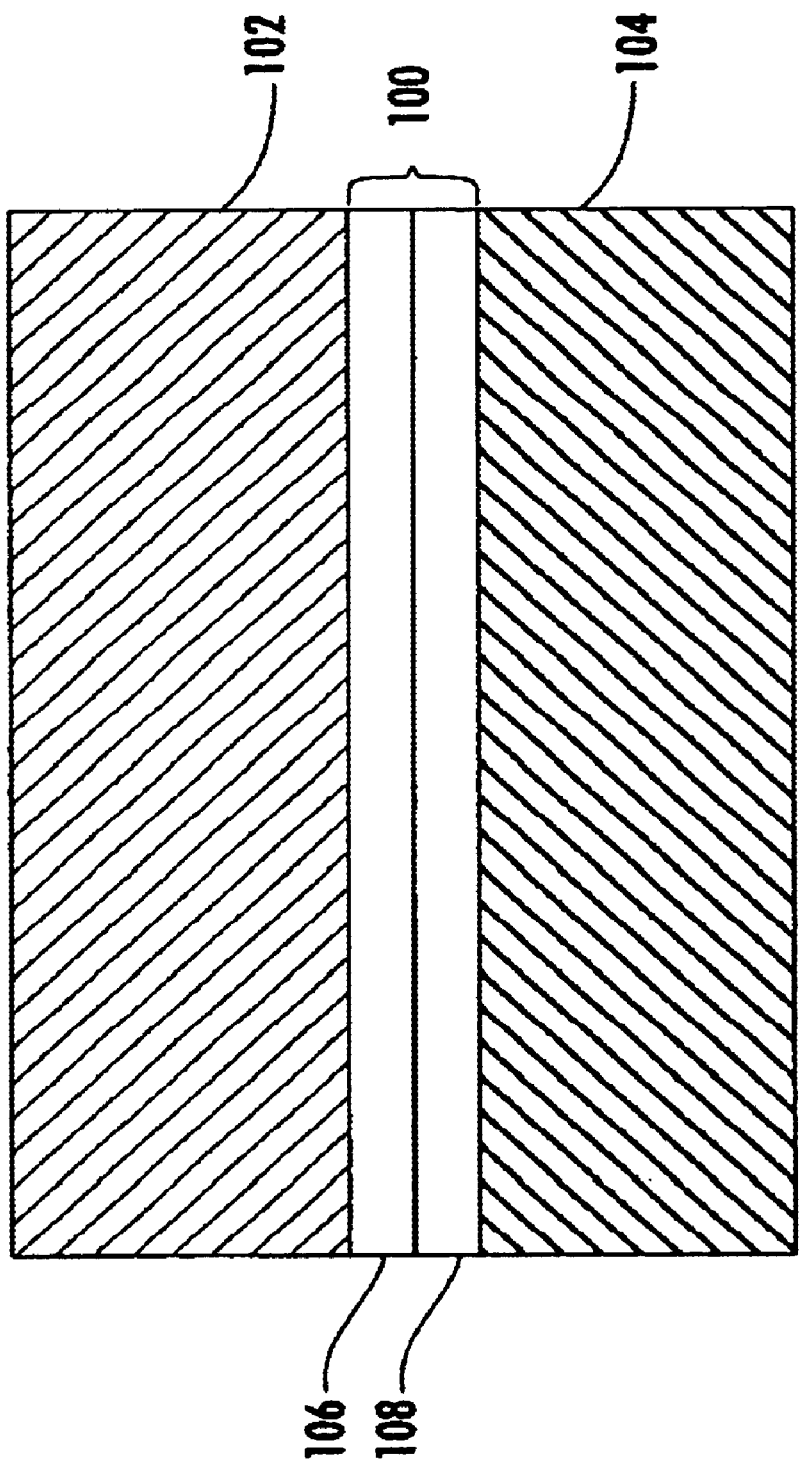
FIG. 7 is a cross-sectional view of a low resistance DBR having a step graded interfacial transition layer between the low and high index layer pairs in accordance with an exemplary embodiment of the present invention.

Referring to FIG. 7, in an alternate embodiment of the present invention, a step graded interfacial transition layer 100 may be integrated between the high and low index layers, 102 and 104 respectivly, to further reduce heterojunction energy band discontinuities between the adjacent semiconductor layers. An exemplary step graded interfacial transition layer for an AlGaAs/GaAs material system may comprise, for example, a 2–8 nm thick layer 106 formed from $Al_xGa_{1-x}As$ with an aluminum composition ranging from about $0.05<x<0.15$. The described exemplary step graded interfacial transition layer may further comprise a second 2–8 nm thick layer formed from $Al_yGa_{1-y}As$ with an aluminum composition ranging from about $0.15<y<0.25$. One of skill in the art will appreciate that the aluminum composition in the transition layer may vary in accordance with material composition of the alternating layers in the DBR. Therefore, the disclosed compositional ranges are by way of example only and not by way of limitation.

In accordance with an exemplary embodiment the combined thickness of the two transition layers is in the range of about 6–12 nm. In an exemplary embodiment, the thickness of the high and low index layers are reduced to accommodate the thickness of the graded interface in order to optimize the reflectivity of the DBR.

In the described exemplary embodiment the transition layer may be doped with a suitable n-type dopant such as for example silicon. In the described exemplary embodiment the doping level is approximately 2–6 times the average doping level of the alternating high and low index layers.

The doping levels of an exemplary n-type mirror may be chosen to provide a substantially constant conductivity across the mirror layers. As is known in the art the conductivity of a semiconductor material is a function of the doping concentration and mobility whereas loss is simply a function of the number of free carriers. The mobility in the AlGaAs is less than the mobility in the GaAs. Thus AlGaAs has a lower conductivity than GaAs for a given doping concentration.

Accordingly, for a given conductivity the low index AlGaAs mirror layers 104 may be more heavily doped than the high index GaAs mirror layers 102 to reduce the resistance across the mirror without incurring an increase in the loss in the high mobility GaAs layer. Therefore, in the described exemplary embodiment the interfacial transition layers may be more heavily doped on the upward grade than on the downgrade of the DBR.

Figure 8:
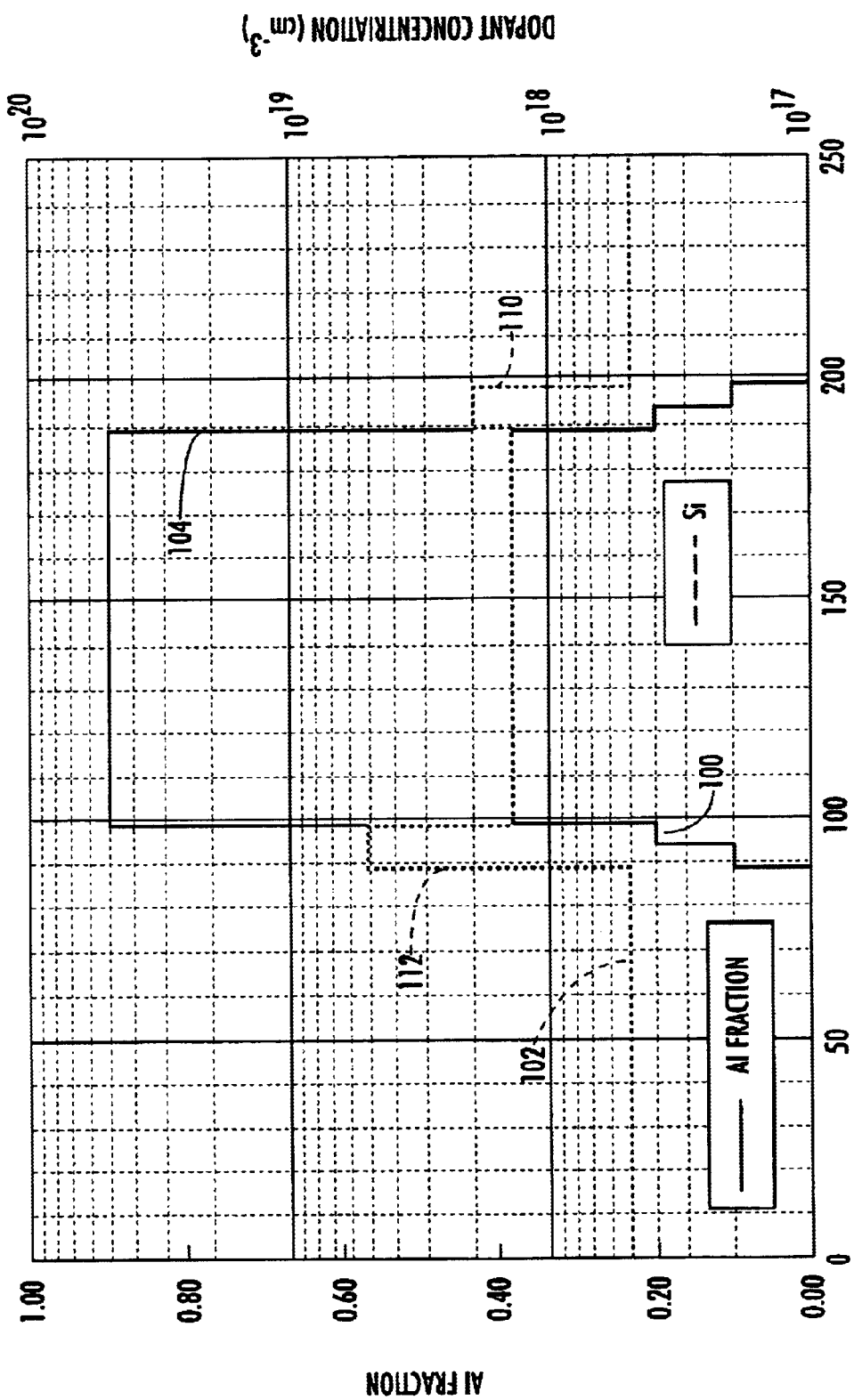
FIG. 8 graphically illustrates the composition and doping of a low resistance DBR having a step graded interfacial transition layer between the low and high index layer pairs in accordance with an exemplary embodiment of the present invention.

For example, referring to FIG. 8, in an exemplary embodiment, the low index layers may comprise $Al_{0.94}Ga_{0.06}As$ and may be doped with silicon at a density of about $1.5 \times 10^{18}$ cm$^{-3}$. The high index layers may comprise GaAs and may be doped with silicon at a density of about $5 \times 10^{17}$ cm$^{-3}$. In this embodiment the interfacial transition layer may be doped with silicon with a donor concentration on the downward grade 110 of approximately $2 \times 10^{18}$ cm$^{-3}$ and a donor concentration of approximately $5 \times 10^{18}$ cm$^{-3}$ on the upward grade 112.

Figure 9:
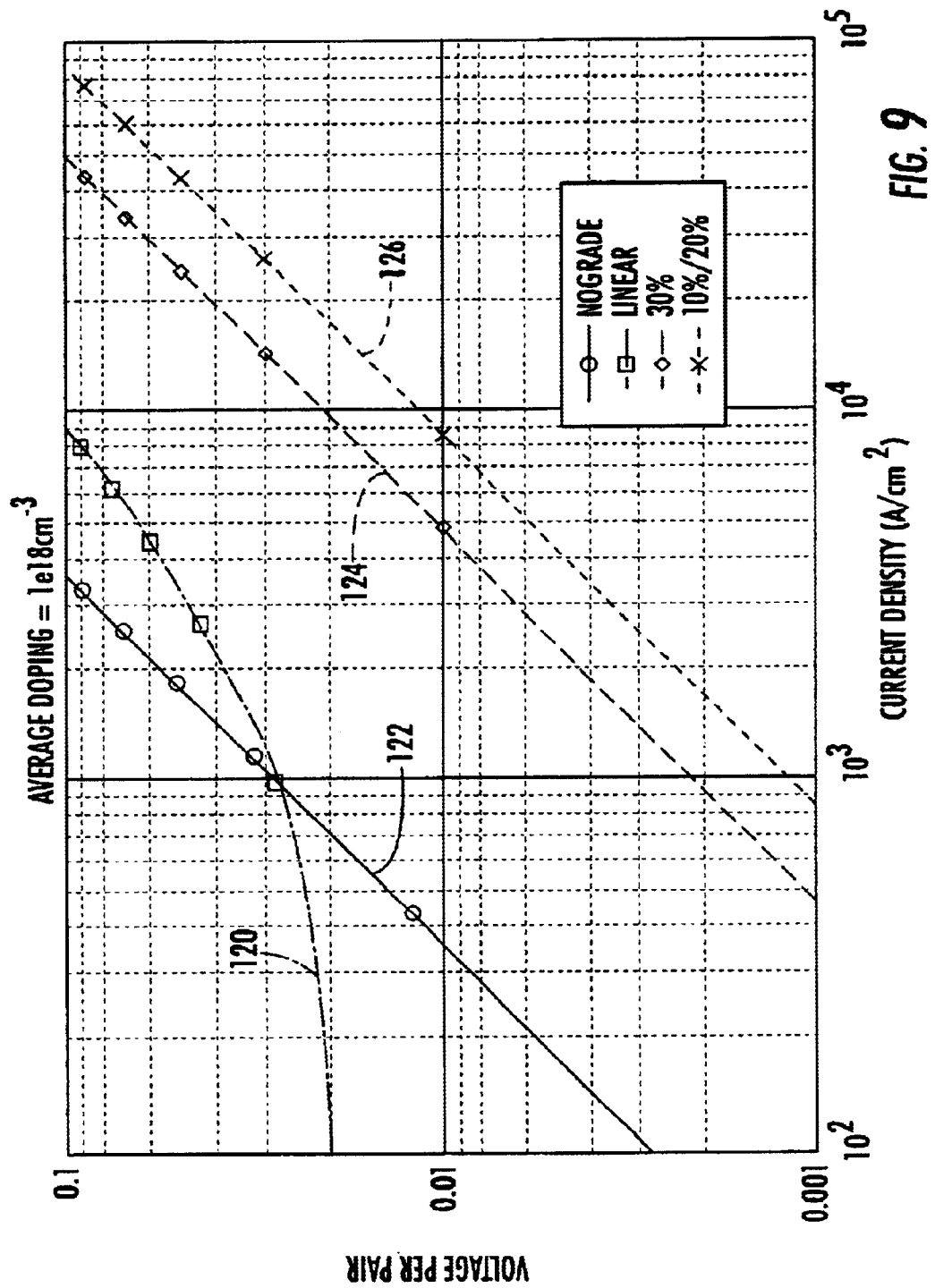
FIG. 9 graphically illustrates the current density versus voltage drop per mirror layer pair for a conventional n-type DBR, a DBR having a homogenous interfacial transition layer, a DBR having a step graded interfacial transition layer and a DBR having a linearly graded interfacial transition layer in accordance with an exemplary embodiment of the present invention.

For purposes of illustration, FIG. 9 graphically illustrates the estimated voltage drop per mirror period as a function of current density for a variety of mirror designs. For example, an n-type DBR having a linear compositional grade transition layer 120 reduces the voltage drop as compared to a conventional n-type DBR with no transition layer 122 for relatively high current densities. However, the linear compositional grade transition layer may actually increase the voltage drop per mirror period for relatively low current densities.

An exemplary 10 nm thick interfacial transition layer 124 with a 30% aluminum composition (i.e. $Al_{0.3}Ga_{0.7}As$) reduces the voltage drop per mirror period as compared to the conventional and linear compositional grade for all current densities. In addition, an exemplary step graded interfacial transition layer 126 comprising a 5 nm thick layer of $Al_{0.1}Ga_{0.9}As$ and a 5 nm thick layer of $Al_{0.2}Ga_{0.8}As$ provides a lower voltage drop than the constant 30% transitional layer for all current densities.

Figure 10:
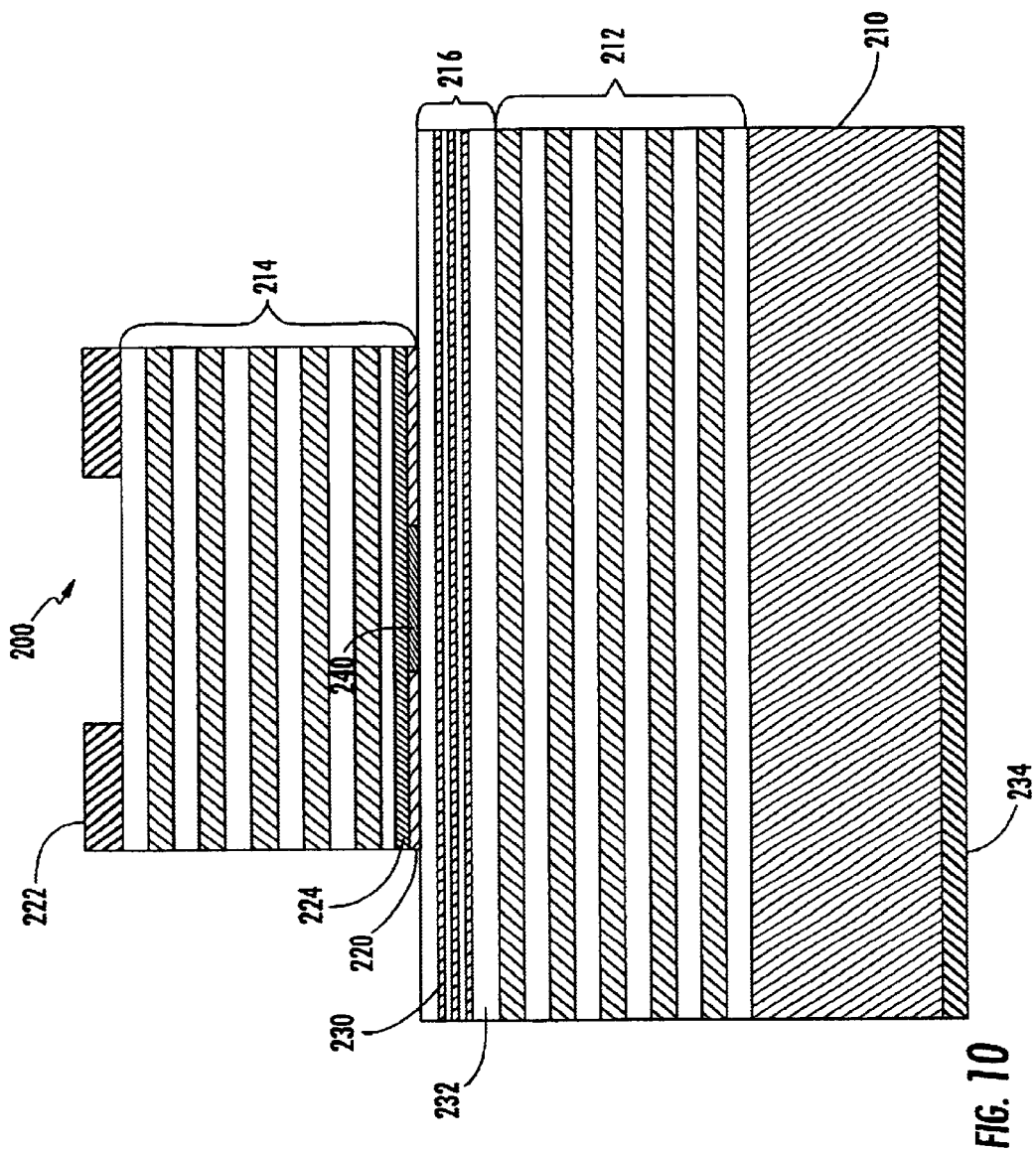
FIG. 10 is a cross-sectional view of a long wavelength tunnel junction VCSEL having low resistance, n-type upper and lower mirrors in accordance with an exemplary embodiment of the present invention.

The advantages of the present invention may, be best understood in the context of an exemplary optoelectronic device. For example, the present invention may be integrated into a low resistance light emitting device that emits at a nominal wavelength of 1300 nm. Referring to FIG. 10, an exemplary light emitting device 200 may comprise a layered structure in which lasing light is emitted in a vertical direction, that is perpendicular to the plane of the layers. The described exemplary light-emitting device 200 may be formed from III–V or II–VI compound semiconductor materials with embodiments of the invention being in the form of a vertical-cavity surface-emitting laser (VCSEL).

In a first embodiment of the, present invention, the semiconductor light-emitting device 200 comprises a plurality of compound semiconductor layers epitaxially-grown on a semiconductor substrate 210. In the described exemplary embodiment the semiconductor layers form a lower mirror stack 212 above the substrate, an upper mirror stack 214 above the lower mirror stack and an active region 216 sandwiched between the mirror stacks. The described exemplary embodiment may further comprise an oxidation aperture 220 located between the active region 216 and the upper mirror stack 214.

In the described exemplary embodiment, the semiconductor layers are etched downward at least to the oxidation aperture 220, thereby forming a mesa. An optional insulation layer (not shown) may be provided to protect the etched mesa, and to provide support for an upper electrode 222.

In an exemplary embodiment, the upper and lower mirror stacks are low resistance n-type distributed Bragg reflectors having an interfacial transition layer between the alternating layers of the mirror periods. The utilization of two relatively low doped n-type mirrors advantageously reduces the free carrier absorption, which may be excessive at long wavelengths in p-type material.

The described exemplary embodiment may incorporate a semiconductor tunnel junction 224 into the high index GaAs upper mirror layer nearest to, the active region 216 to accommodate uni-polar n-type mirrors. In accordance with an exemplary embodiment, the heavily doped tunnel junction 224 may be positioned at a node (i.e. a minimum) of the longitudinal field to reduce or minimize absorption while enabling the conversion of electrons to holes for injection into the active region.

The described exemplary tunnel junction VCSEL 200 may be grown on a GaAs substrate 210, using, for example, molecular beam epitaxy or other suitable methods. In an exemplary embodiment the active region 216 may comprise at least one active layer 230 sandwiched between a pair of barrier layers 232. The oxidation layer 220 is grown on an upper barrier layer and the tunnel junction 224 is formed in a high index GaAs layer nearest to the optical cavity in the upper mirror stack. The upper mirror stack 214 is then grown on an upper surface of the tunnel junction 224.

In accordance with an exemplary embodiment, upper and lower electrodes 222 and 234 may be deposited above the upper mirror 214 and below the active region 216 respectively to electrically contact the VCSEL. The upper electrode 222 may be deposited before or after formation of the mesa. If the upper electrode 222 is deposited before the formation of the mesa and patterned by an etching or lift off step, the upper electrode may either be protected by an overlying layer deposited and patterned for use as an etch mask, or the upper electrode may form at least a part of the etch mask.

In one embodiment the upper electrode 222 may be formed, for example, by depositing an n-type metalization such as AuGe/Ni/Au above the mirror stack 214, and defining an annular opening therein by a lithographic masking and lift-off process. Likewise, the lower electrode 234 comprises an n-type metalization such as AuGe/Ni/Au in the form of either a full-surface metalization on the lower surface of the n-type substrate 210, or patterned to provide an annular aperture therethrough centered about the active region 216.

In an exemplary embodiment, the annular opening formed through the upper electrode 222 is generally sized to be at least as large in diameter as the oxide-free portion 240 of the oxide aperture 220, but smaller in diameter than the top surface of the mesa. In this way, light may be coupled out from the light-emitting device 200 through the central opening while allowing the electrical current to be efficiently coupled from the upper electrode 222 into the upper mirror stack 214, and therefrom to the active region 216.

In the described exemplary embodiment the semiconductor substrate 210 may comprise GaAs, that may be doped, for example, n-type with a silicon dopant. The GaAs substrate 210 is transmissive for wavelengths above 900 nm. Therefore, in some cases, light may be emitted from the lower side of the VCSEL through an annular aperture formed in the lower electrode 234 to enable backside monitoring of the laser output intensity for control thereof to maintain a consistent laser output over time.

The mesa formed in the upper mirror layers confines current flow in the upper mirror structure into a substantially reduced area, increasing the current density in the constricted region by orders of magnitude above the current density in the lower or un-constricted mirror layers. The increased current density in the upper mirror layers may result in a substantial voltage drop across the upper mirror layers. Therefore, at least the upper mirror or if desired, both the upper and lower mirror of the described exemplary tunnel junction VCSEL may comprise a low electrical resistance DBR with a constant or step graded interfacial transition layer as described with respect to FIGS. 2 and 7 respectively.

The oxide aperture 220 may comprise a semiconductor alloy containing aluminum. The semiconductor alloy may be oxidized in part after the mesa is formed in the VCSEL structure, to or below the oxide aperture. The oxidized outer portion of the oxide aperture has increased resistivity providing lateral current constriction and index guiding to control the transverse higher order modes. In accordance with an exemplary embodiment, the current constriction formed by the oxidized portion of the oxide aperture reduces the diameter of the current aperture below the diameter formed by the VCSEL electrodes. In addition, an oxide free central portion of the oxide aperture remains substantially transmissive to light.

The oxide aperture 220 comprise oxide aperture layers having a semiconductor alloy composition and layer thickness that is different from the composition and layer thickness of any of the other compound semiconductor layers in the structure exposed by the etch. As an example, the oxide aperture layers may be formed from AlAs or from AlGaAs with an aluminum composition higher than the aluminum composition of AlGaAs high-bandgap semiconductor layers in the upper mirror 214. In this example, the aluminum composition of the oxide layers may be higher than any of the layers of the active region 216.

The aluminum composition of the oxide aperture layers may be used to selectively oxidize the semiconductor alloy, converting it to an oxide of aluminum. The selective oxidation is the result of a strong compositional dependence in the lateral oxidation of $Al_xGa_{1-x}As$ layers for aluminum concentrations (x) in the range of about 0.8 to 1.0.

In accordance with an exemplary embodiment, the oxide aperture 220 may be doped with a dopant type that is the same as the mirror layer or tunnel junction layer immediately adjacent to the oxide layer. Thus, the oxide aperture 220, located between the active region 216 and the p-type layer of the tunnel junction, is doped p-type with a relatively low doping density of Be, C or other suitable dopant. The dopant density in the upper oxide aperture may be in the range of about $1\times10^{16}-5\times10^{17}$ cm$^{-3}$. One of skill in the art will appreciate that the oxidation aperture may be doped with other suitable materials or at higher doping densities with a commensurate increase in the optical loss.

In the described exemplary embodiment, a compound semiconductor active region 216 is sandwiched between the upper and lower mirror stacks 214 and 212. In the described exemplary embodiment the active region 216 has a thickness that is an integral multiple of one-half of the wavelength of the light generated in the active region. The active region may include one or more quantum-wells 230 surrounded by barrier layers 232. As is known in the art, the quantum-wells provide quantum confinement of electrons and holes therein to enhance recombination for the generation of the light.

In an exemplary embodiment of the present invention, the active region 216 comprises one or more $In_xGa_{1-x}As_{1-Y}N_Y$ quantum wells 230 designed to emit at wavelengths in the range of about 1240 nm to 1360 nm. In the described exemplary embodiment the fractional composition of indium (In) may range from about 0.3–0.4, and the nitrogen may range from about 0.01–0.02. In an exemplary embodiment, there are two $In_{0.34}Ga_{0.66}As_{0.99}NO_{0.01}$ quantum wells, with barrier layers surrounding and separating the quantum wells. The barrier layers may have an energy bandgap intermediate between the energy bandgaps of the quantum-well layers 230 and the oxidation aperture 220 and lower mirror.

The described exemplary embodiment incorporates a tunnel junction 224 into the high index GaAs layer nearest to the active region 216 in the upper mirror stack 214. The tunnel junction 224 injects holes into the active layer without having the absorption that is characteristic of a p-type output mirror. In accordance with an exemplary embodiment, the heavily doped tunnel junction 224 may be positioned at a node of the longitudinal field to reduce or minimize absorption while enabling the conversion of electrons to holes for injection into the active region.

In the described exemplary embodiment the tunnel junction 224 comprises a p-type layer and an n-type layer. The p-type layer may be in the range of about 10–100 angstroms thick. The p-type layer of the tunnel junction may be doped with a suitable dopant such as for example carbon (C) at a density in the range of about $2\times10^{19}-2\times10^{20}$ cm$^{-3}$. The n-type layer of the tunnel junction may be in the range of 50–500 angstroms thick. The n-type layer of the tunnel junction may be doped with a suitable dopant, such as, for example silicon (Si) at a density in the range of about $4\times10^{18}-4\times10^{19}$ cm$^{-3}$.

The mesa may be formed by etching down at least to the oxide aperture by a wet or a dry etching process such as reactive ion etching (RIE), reactive ion beam etching (RIBE), or the like. The mesa may be formed by lithographically patterning the top surface of the upper mirror 214 and depositing thereon a suitable material (for example, silicon nitride, silicon oxide, silicon oxynitride, metal silicides, or refractory metals) as an etch mask. After etching the mesa structure down to or through the oxide aperture 220, the etch mask may be left in place to protect the top layer of the upper mirror, or removed prior to the oxidation process. In forming the mesa, the etch depth may be measured in-situ by reflectometry to provide a precise control of the etch depth, and to allow the etch process to be stopped after etching down at least to the oxide aperture.

The oxidation process may be carried out by placing the wafer into a container and heating the wafer to a temperature of about 350 to 500° C. under a controlled environment having a high humidity. Such a moist environment may be generated, for example, by flowing a gas, such as nitrogen, through water heated to about 80–95° C. to entrain water vapor, and then directing the moisture-laden gas into the container.

The time required for formation of the annular oxidized portion of the oxide aperture 220 depends upon a number of variables. For example, the formation time may vary in accordance with the aluminum composition of the oxide aperture layers forming the oxide aperture 220, the temperature to which the semiconductor wafer is heated as well as the thickness of the oxide aperture layers. In addition the formation time depends upon the lateral extent to which the oxide aperture layers are to be oxidized (i.e. the lateral dimension of the annular oxidized portion). Generally, a 50 nm thick oxide aperture layer will oxidize in about 30 to 150 minutes with an oxidation temperature in the range of about 380 to 450° C. The composition and quality of the aluminum oxide formed by the oxidation process may also be temperature dependent.

The described exemplary tunnel junction VCSEL with low resistance n-type upper and lower mirrors is a relatively low voltage device. For example, FIG. 11 graphically illustrates the voltage and light output of the described exemplary tunnel junction VCSEL using an $Al_{0.3}Ga_{0.7}As$ interfacial transition layer between the high and low index mirror layers. In this embodiment the bias voltage is less than 5 volts for drive currents up to 6 mA and an output intensity of approximately 7 mW.

One of skill in the art will appreciate that the present invention is not limited to the described exemplary tunnel junction VCSEL. Rather, the low electrical resistance mirror having a constant or step graded interfacial transition layer may be utilized in a variety of other optoelectronic devices. For example referring to FIG. 12, in an alternate embodiment the tunnel junction may be replaced with a p-type upper mirror for providing holes for injection into the active region. In this embodiment, a plurality of compound semiconductor layers are epitaxially grown on a semiconductor substrate 310. The semiconductor layers form a lower mirror stack 312 above the substrate, an upper mirror stack 314 above the lower mirror stack, an active region 316 sandwiched between the mirror stacks, and an oxidation aperture 320 located between the active region 316 and the upper mirror stack 314. The semiconductor layers may be etched downward to expose the oxidation aperture 320, thereby forming a mesa.

In the described exemplary embodiment a p-type ohmic contact 322 is deposited above the upper mirror stack 314 and an n-type ohmic contact 324 may be deposited below the substrate 310. The p-type ohmic contact 322 may be, for example, gold with 2% beryllium added or a layered structure of titanium/platinum/gold. The p-type ohmic contact may be deposited by electron beam evaporation or other techniques known in the art. The n-type ohmic contact 324 may comprise an n-type metalization such as AuGe/Ni/Au in the form of either full-surface metalization on the lower surface of the substrate 310, or patterned to provide an annular aperture therethrough centered about the active region 316.

In the described exemplary alternate embodiment, the lower and upper mirror stacks may be composed of quarter-wavelength-thick alternating layers of $Al_{0.90}Ga_{0.10}As$ and GaAs for operation at a wavelength near 1300 nm. In the described exemplary embodiment, the lower mirror comprises thirty six mirror periods and the upper mirror stack comprises twenty three mirror periods. One of skill in the art will appreciate that the Al content in the AlGaAs upper and lower mirror stacks may vary in the range of about 0.8–0.96.

Figure 12:
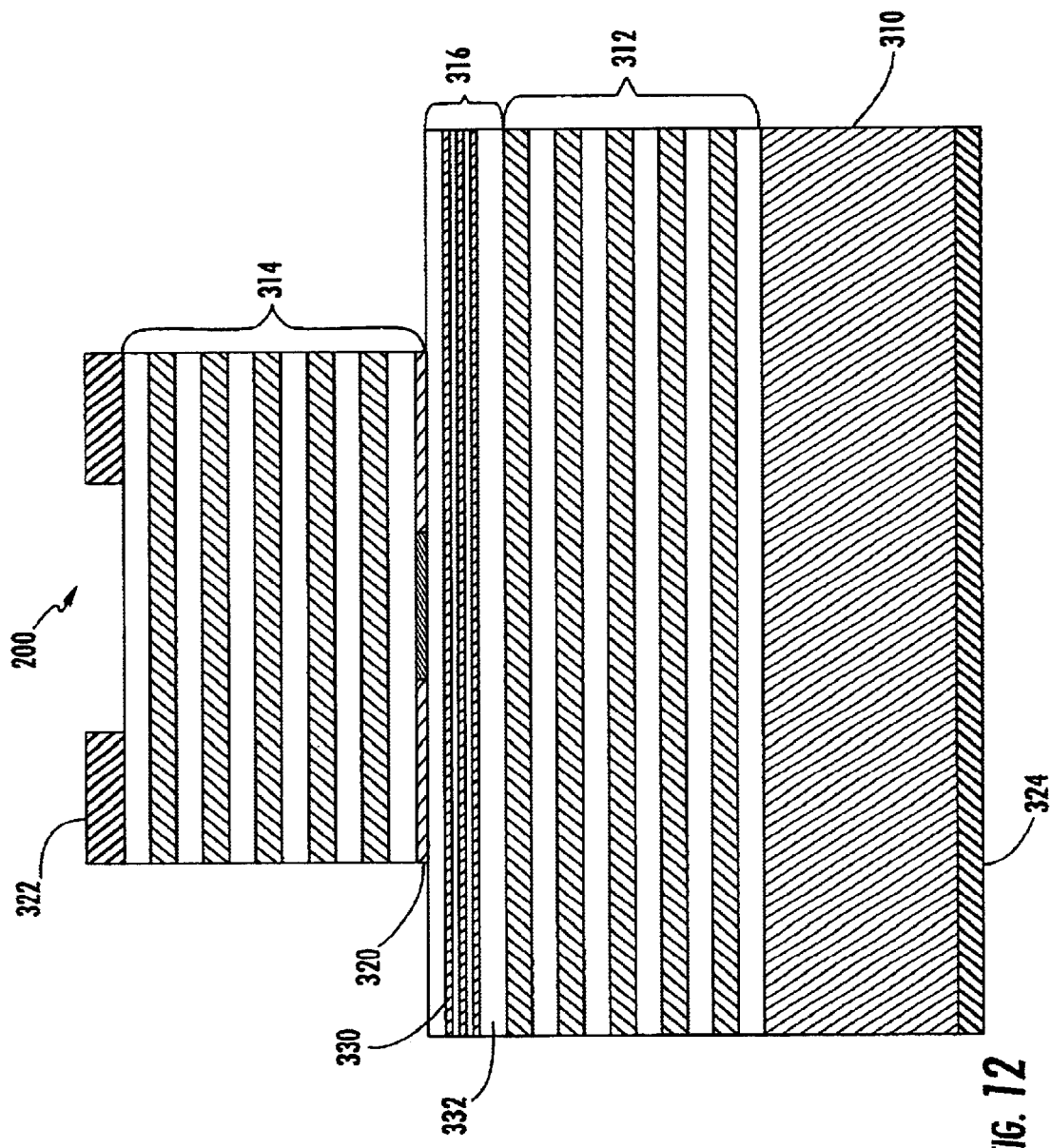
FIG. 12 is a cross-sectional view of a long wavelength VCSEL having a low resistance, n-type lower mirror and a p-type upper mirror in accordance with an exemplary embodiment of the present invention.
Figure 13:
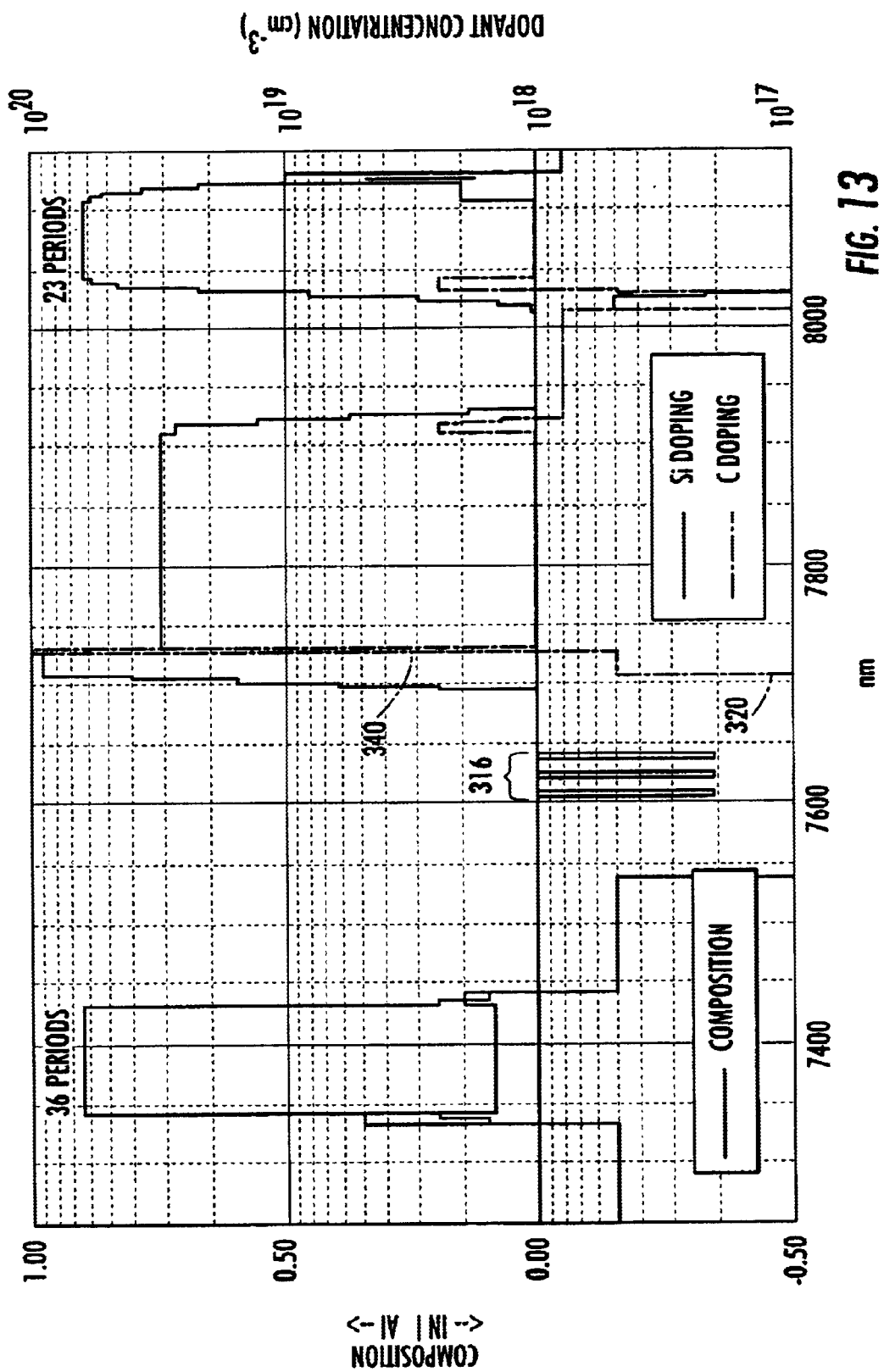
FIG. 13 graphically illustrates the alloy composition and doping levels of the VCSEL illustrated in FIG. 12, including one period of the lower mirror stack adjacent to the active region, through the first period of the upper mirror stack adjacent to the active region in accordance with an exemplary embodiment of the present invention.

FIG. 13 graphically illustrates the alloy compositions and doping levels of the VCSEL illustrated in FIG. 12 including one period of the lower mirror stack adjacent to the active region, through the first period of the upper mirror stack adjacent to the active region. In one embodiment the active region 316 of the alternate VCSEL may comprise one or more undoped InGaAsN quantum wells 330 separated by GaAs barrier layers 332 for emission at a nominal wavelength of 1300 nm. Fractionally the. In may range from about 0.3–0.4, and the Nitrogen may range from greater than 0.01 to less than about 0.02.

In the described exemplary alternate embodiment, there are three $In_{0.34}Ga_{0.66}As_{0.988}N_{0.012}$ quantum wells, with barrier layers surrounding and separating the quantum wells. The barrier layers may have an energy bandgap intermediate between the energy bandgaps of the quantum-wells and the oxidation aperture and lower mirror stack. The quantum-wells provide quantum confinement of electrons and holes therein to enhance recombination for the generation of the light.

In the described exemplary alternate VCSEL structure, an oxide aperture 320 may again be formed above the active region. The oxide aperture layers may again be formed from AlAs or from AlGaAs with an aluminum composition higher than the aluminum composition of AlGaAs high-bandgap semiconductor layers in the upper mirror stack. In the described exemplary embodiment, the semiconductor layers forming the oxide aperture contain an Al concentration of about 98%. The oxide aperture 320 may be doped with a dopant type that is the same as the mirror layer immediately adjacent to the oxide aperture. Thus, in the described exemplary embodiment the oxide aperture between the active region and the p-type upper mirror stack is p-type with a carbon dopant at a concentration of about $5 \times 10^{17}$ $cm^{-3}$.

The alternate structure includes a highly conductive current spreading layer 340 comprising a carbon doping spike at a concentration of about $1 \times 10^{20}$ $cm^{-3}$ above the oxide aperture. The current spreading layer provides a more uniform current distribution across the oxide aperture improving current injection into the active region and reducing the device resistance. The alternate VCSEL structure further includes a 75% aluminum transition layer and a twenty three period p-type upper mirror stack.

In the described exemplary embodiment, the lower mirror stack is doped n-type and the upper mirror stack is doped p-type The upper and lower mirror stacks are highly reflective, having greater than 99% reflectivity in the described exemplary embodiment. Conventionally, highly reflective DBRs have the disadvantage of being highly resistive with significant levels of self heating that may impair the performance of the device. Therefore, in the described exemplary embodiment, the upper and lower mirror stacks are designed to reduce the voltage drops as well as the loss or absorption associated with conduction through the mirror stacks.

For example, the lower n-type mirror may comprise a low electrical resistance DBR having a constant or step graded interfacial transition layer as previously described with respect to FIGS. 2 and 7. An exemplary p-type upper mirror may also include compositional grading of the Al concentration and doping across the heterojunction interface between alternating layer pairs to reduce its electrical resistance.

Figure 14:
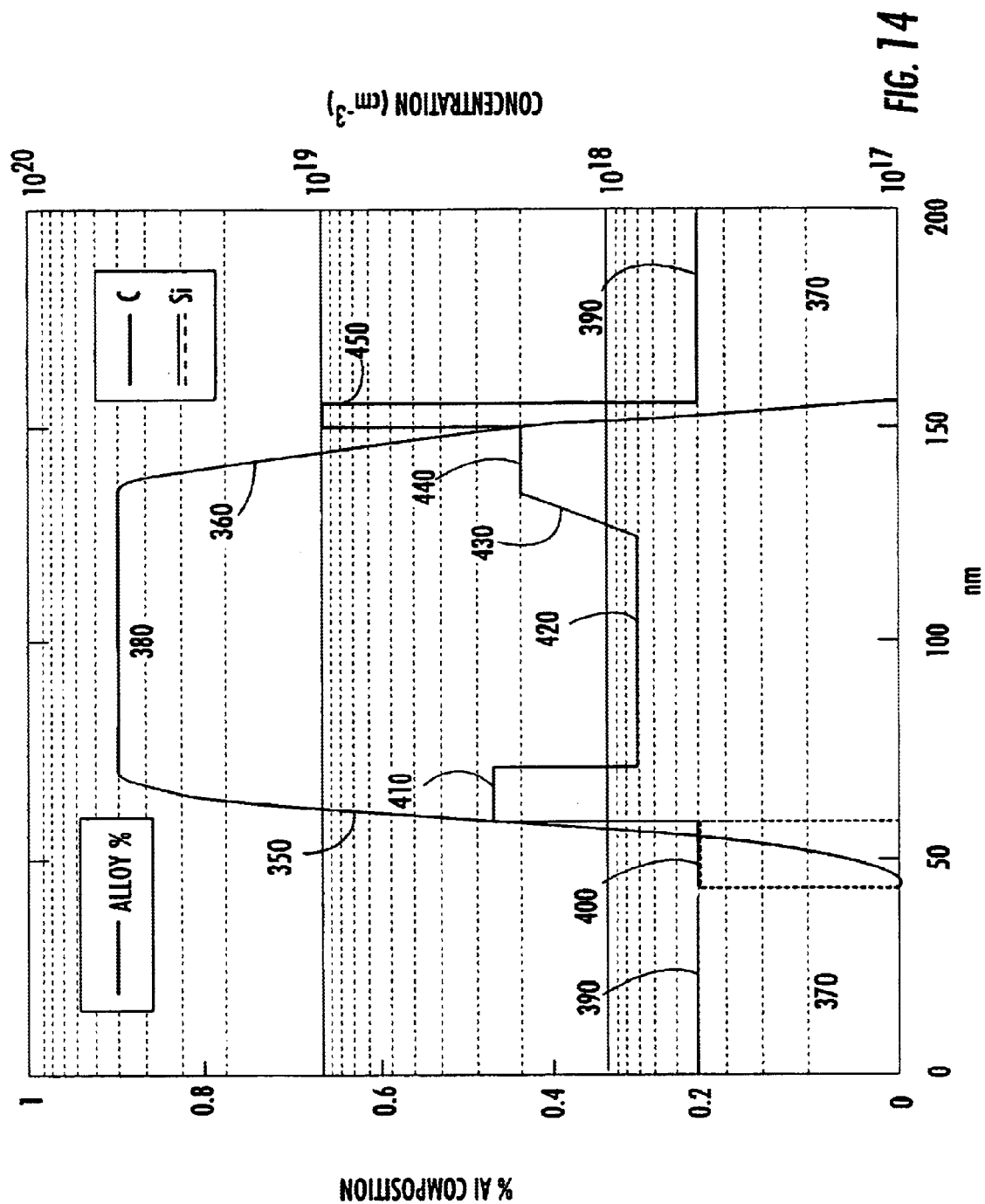
FIG. 14 graphically illustrates the alloy compositions and doping levels of the upper p-type mirror of the VCSEL of FIG. 12 in accordance with an exemplary embodiment of the present invention.

FIG. 14 graphically illustrates the alloy compositions and doping levels of an exemplary p-type upper mirror stack. In the described exemplary embodiment the p-type upper mirror stack includes biparabolic grading 350 of the Al concentration across the interface of a GaAs mirror layer 370 and a AlGaAs layer 380. The biparabolic grading of the Al concentration flattens the valence band by increasing the energy at the bottom of the band and decreasing the energy at the top of the band. Thus the biparabolic grading may decrease the band-discontinuity of the valence band on a hetero-interface between a high index layer and a low index layer.

In an exemplary embodiment of the present invention the GaAs mirror layers 370 are p-type with a carbon dopant at a concentration in the range of about $2 \times 10^{17}$–$2 \times 10^{18}$ cm$^{-3}$ with a concentration near $5 \times 10^{17}$ cm$^{-3}$ in the described exemplary embodiment. However, the described exemplary p-type upper mirror stack may include an n-type doping spike 400 and a p-type doping spike 410 at the layer edges of the biparabolic upward GaAs and AlGaAs interface 350.

The n-type 400 and p-type 410 doping spikes flatten the valence band, and further reduce the bandgap discontinuity across the layer interface and therefore further improve the vertical conductivity of the mirror stack. In an exemplary embodiment of the present invention the n-type region 400 may be doped with silicon at a concentration in the range of about $2 \times 10^{17}$–$2 \times 10^{18}$ cm$^{-3}$ with a concentration of about $5 \times 10^{17}$ cm$^{-3}$ in the described exemplary embodiment. In an exemplary embodiment the p-type doping spike 410 at the biparabolic interface is carbon doped at a concentration in the range of about $1 \times 10^{18}$–$3 \times 10^{18}$ cm$^{-3}$ with a concentration of about $2.5 \times 10^{18}$ cm$^{-3}$ in the described exemplary embodiment.

In the described exemplary embodiment the AlGaAs mirror layer 380 includes a region 420 that is p-type, with a carbon dopant at a concentration in the range of $6 \times 10^{17}$–$1 \times 10^{18}$ cm$^{-3}$ with a concentration of about $8 \times 10^{17}$ cm$^{-3}$ in the described exemplary embodiment. A parabolic interface region includes a region 440 wherein the concentration of the carbon doping is increased to a concentration of about $2 \times 10^{18}$ cm-3 that transitions between the low doped region 420 and a carbon doping spike 450 on the downward parabolic grade of the Al concentration. The doping spike 450 may be formed from a carbon dopant at a concentration in the range of $5 \times 10^{18}$–$2 \times 10^{19}$ cm$^{-3}$ with a concentration of about $1 \times 10^{19}$ cm$^{-3}$ in the described exemplary embodiment.

In the described exemplary embodiment the carbon doping spike 450 may be located at a null in the optical wave pattern of the VCSEL structure thereby increasing the number of holes at a point of reduced field strength to reduce free carrier absorption. The increased doping level in region 440 flattens the valence band in this region by compensating the hole depletion from the high aluminum composition of the parabolic grade. The increased doping level therefore reduces the bandgap discontinuity across the interface between the low doped 420 and high doped regions 450, thereby improving the vertical conductivity of the device.

One of skill in the art will appreciate that the present invention is not limited to optoelectronic VCSEL transmitters. Rather, the present invention may be integrated into a variety of optoelectronic devices. For example, high speed photodetectors often incorporate a highly reflective mirror adjacent a substrate to increase the responsivity of the photodetector. In operation, light that enters the photodetector and passes through the absorbing layer without being absorbed is reflected back into the absorbing layer to be absorbed.

Figure 15:
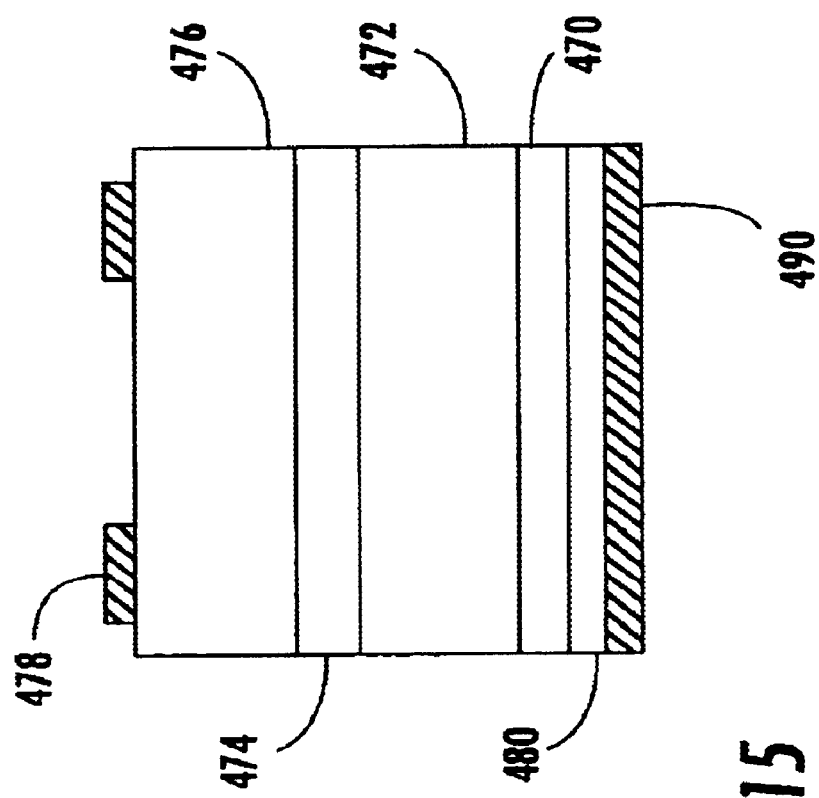
FIG. 15 is a cross-sectional view of a photodiode having a low resistance n-type mirror in accordance with an exemplary embodiment of the present invention.

Referring to the cross section of FIG. 15, the described exemplary low resistance n-type mirror having a constant or step graded interfacial transition layer 470 may be formed adjacent a GaAs n-type substrate 480. In accordance with an exemplary embodiment an n-type layer 472 may be formed adjacent the low resistance n-type mirror. In an exemplary embodiment, the n-type layer 472 may be formed of aluminum gallium arsenide (AlGaAs). The n-type layer 472 may be doped with a suitable n-type dopant, such as for example, silicon at a concentration in the range of about $1 \times 10^{18}$ to $5 \times 10^{18}$ cm$^{-3}$.

An active absorber region 474 that is absorptive at the wavelength of interest may be epitaxially formed on the n-type layer 472. In the described exemplary embodiment, the active absorber region 474 may comprise a gallium arsenide (GaAs) intrinsic layer. As is known in the art, the bandwidth of a photodetector is generally determined by the transit time of the photo-generated carriers in the absorption region and the RC time constant. The described exemplary low resistance, low loss mirror may therefore improve the responsivity of the device by allowing for a thinner intrinsic layer to reduce transit time, while maintaining high levels of absorption by reflecting light back into the intrinsic layer.

In an exemplary embodiment an upper p-type layer 476 is formed adjacent the intrinsic layer 474 from aluminum gallium arsenide (AlGaAs). The p-type layer 476 may be doped with a suitable p-type dopant, such as carbon, at a concentration in the range of about $1 \times 10^{19}$ to $5 \times 10^{19}$ cm$^{-3}$. The described exemplary p-type layer 476 is substantially transmissive to light at the operating wavelength of interest.

To electrically contact the photodetector p-type and n-type ohmic contacts 478 and 490 may be deposited above the p-type layer 476 and below the substrate 480 respectively. The p-type ohmic contact (also referred to as the annular ohmic contact) may be formed, for example, by depositing a p-type metalization, such as gold with 2% beryllium added or a layered structure of titanium/platinum/gold above the p-type layer. In an exemplary embodiment an annular opening may be formed in the p-type contact by a lithographic masking and lift-off process. The p-type ohmic contact 478 may be deposited by electron beam evaporation. In one embodiment the n-type ohmic contact 490 may be formed, for example, by depositing an n-type metalization such as AuGe/Ni/Au on a lower surface of the substrate.

Figure 16:
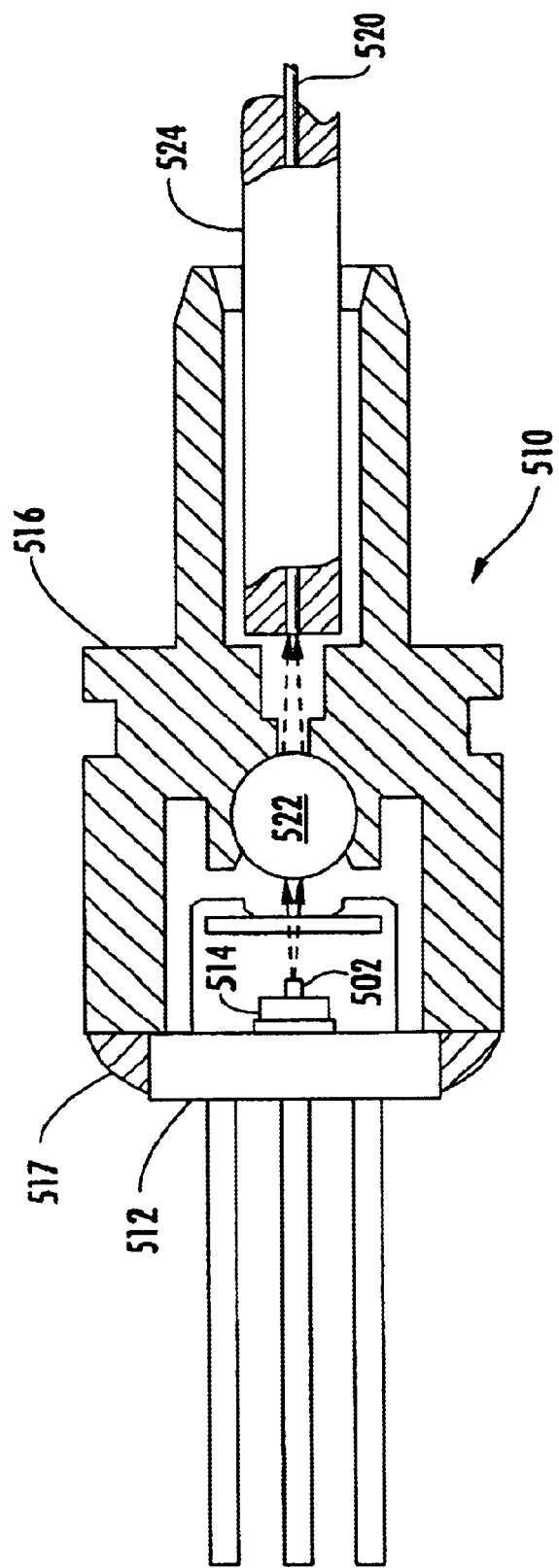
FIG. 16 is a side view, partly in cross-section, of an optical subassembly incorporating the VCSEL with low electrical resistance n-type mirror according to the present invention.
Figure 17:
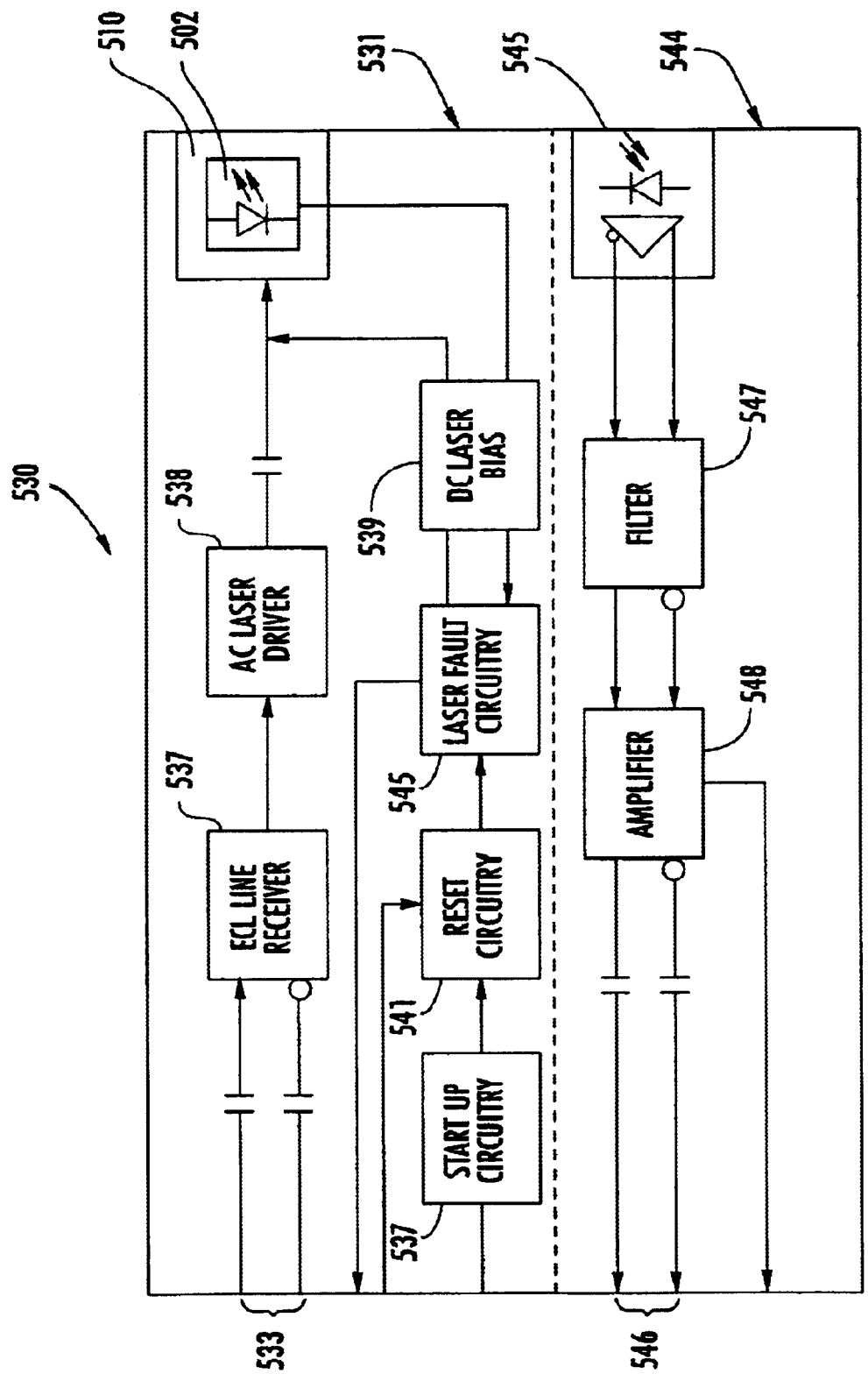

FIG. 16 illustrates an exemplary VCSEL as illustrated in FIG. 10 or 12, with a low electrical resistance n-type mirror having an interfacial transition layer mounted into an optical subassembly (OSA) 510. The OSA enables application of DC biasing and AC modulation signals to the VCSEL. With the exception of the VCSEL 502, all of the parts of the OSA are conventional. The OSA generally comprises an electrical package 512 containing the VCSEL 502 and a power monitoring photodetector 514.

The electrical package may be bonded to a precision molded plastic housing 516. The bonding process including conventional bonding material 517 may involve active alignment to optimize the coupling of the laser light into an optical fiber 520, as is conventional in the art. The described exemplary OSA may include a focusing element, such as, for example, a ball lens 522 for coupling the light into the optical fiber. A ferule 524 provides alignment of the optical fiber. After the electrical package 512 and housing 516 are bonded together, the fiber is removed and the OSA 525 is complete. An exemplary optical subassembly is also described in. U.S. patent application Ser. No. 08/900,507, filed Jul. 25, 1997, the contents of which are hereby incorporated by reference.

The incorporation of a low resistance n-type DBR into the VCSEL 502, provides for more toleration of temperature variation in the OSA. In addition the described exemplary VCSEL allows for the utilization of a reduced drive current in the OSA and in the higher level assemblies. Reducing the power drive current and the power dissipation of the device reduces manufacturing complexity and increases yield, thereby resulting in lower overall product cost.

Figure 17:
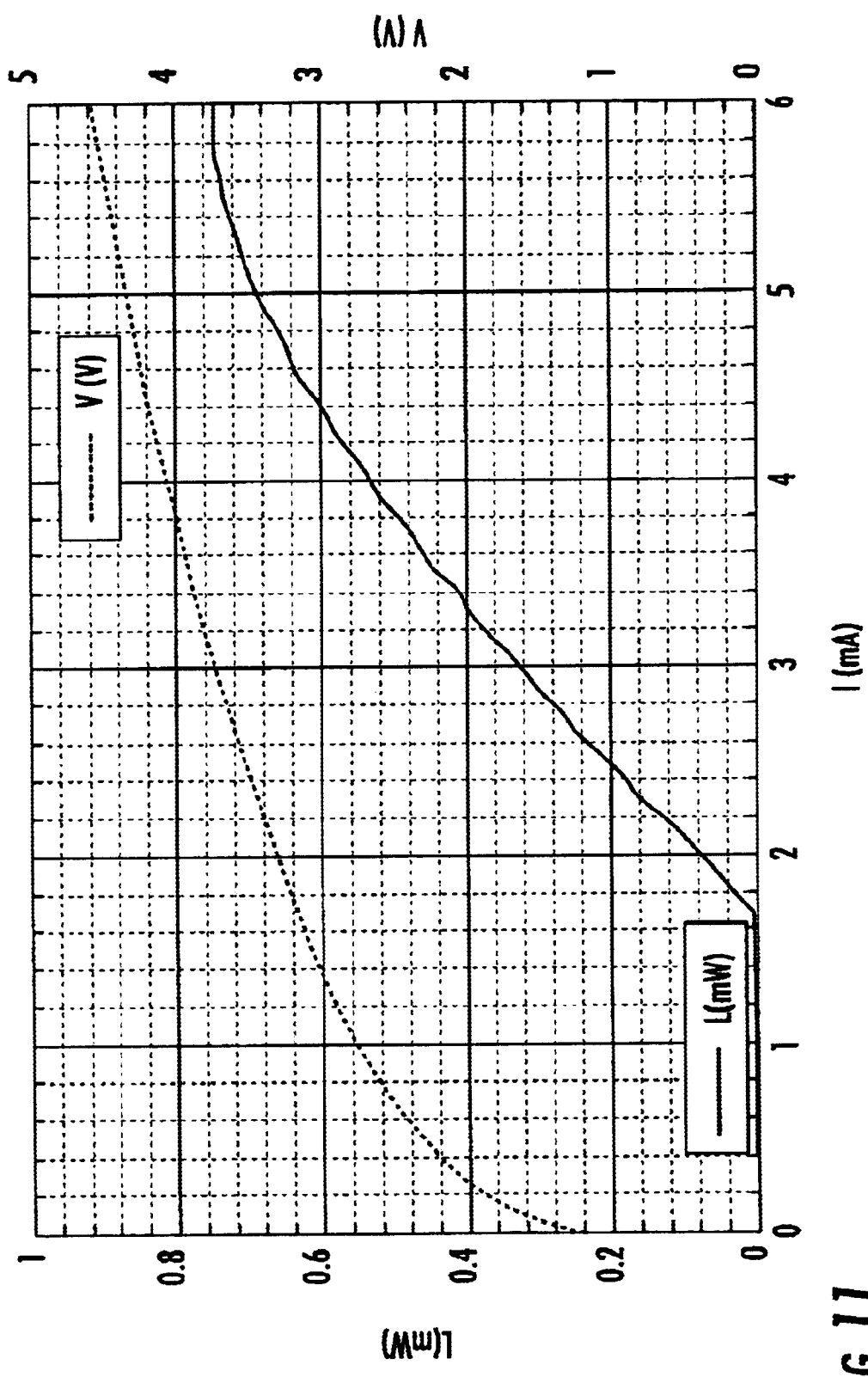
FIG. 17 is a block diagram of an optical transceiver incorporating the optical subassembly of FIG. 16.

FIG. 17 illustrates in block diagram form an optical transceiver 530 incorporating a VCSEL 502 with a low electrical resistance n-type mirror having an interfacial transition layer fabricated according to the inventive method. With the exception of the VCSEL 502, all of the parts of the optical transceiver are conventional. The transceiver includes a transmitter portion 531 and a receiver portion 544. The transmitter portion provides an interface between a differential input 533 and an optical fiber output.

In operation, a differential input signal is converted to a single ended signal by emitter coupled logic (ECL) line receiver 537 and an AC modulation signal is applied to the single ended signal in laser driver 538. A DC bias signal is then applied to the signal by DC laser bias signal generator 539 for application to the OSA 510. Start up circuitry 540 and reset circuitry 541 may be provided to control the transmission of data over the optical fiber. A laser fault indicator 545 provides a status indication of the transmitter portion 531.

The receiver portion 544 takes an input from an optical fiber provided through a photodetector 545 and converts it to a differential output signal. The receiver pre amp signal is preferably low pass filtered in filter 547 to remove any high frequency noise present, amplified in amplifier 548 to regenerate the digital signal, and then transmitted off the board through the differential output 546.

The use of VCSELs with low electrical resistance mirrors in optical transceivers enhances the performance and reliability of the data communications system. This is because the total heat dissipation and drive current may be controlled simplifying the drive circuit and temperature compensation apparatus. Such a system will not suffer significant voltage drop across the mirror, and will therefore have the desirable effect of generally improving overall product consistency and yield.

Although exemplary embodiments have been described, they should not be construed to limit the scope of the appended claims. Those skilled in the art will understand that various modifications may be made to the described embodiment. Moreover, to those skilled in the various arts, the invention itself herein will suggest solutions to other tasks and adaptations for other applications. It is therefore desired that the present embodiments be considered in all respects as illustrative and not restrictive, reference being made to the appended claims rather than the foregoing description to indicate the scope of the invention.

What is claimed is:

1. An optoelectronic device comprising:
   an active region sandwiched between an upper mirror and a lower mirror, wherein at least one of said upper and lower mirrors comprises plurality of mirror periods wherein at least a portion of said mirror periods comprise alternating layers of a first material having a first index of refraction and a second material having a second index of refraction with a step graded interfacial transition layer there between.

2. The optoelectronic device of claim 1 wherein said alternating layers of said first material and said second material are doped n-type.

3. The optoelectronic device of claim 2 wherein said step graded interfacial transition layer is doped n-type and where concentration of dopant in said step graded interfacial transition layer is about 2–6 times greater than concentration of dopant in said alternating layers.

4. The optoelectronic device of claim 1 wherein said first material comprises $Al_xGa_{1-y}As$ havng a low index of refraction.

5. The optoelectronic device of claim 1 wherein said second material comprises $Al_yGa_{1-y}As$ having a high index of refraction wherein y is less than 0.3.

6. The optoelectronic device of claim 1 wherein said step graded interfacial transition layer comprises a first transition layer comprising AlGaAs having a first concentration of Al and a second transition layer comprising AlGaAs having a second concentration of Al.

7. The optoelectronic device of claim 6 wherein said first concentration of Al ranges from about 5–15%.

8. The optoelectronic device of claim 6 wherein said second concentration of Al ranges from about 5–15%.

9. The optoelectronic device of claim 1 wherein said active region comprises at least one quantum well.

10. The optoelectronic device of claim 9 wherein said one or more quantum wells comprise InGaAsN.

11. The optoelectronic device of claim 1 wherein the optoelectronic device comprises a VCSEL that emits light at a wavelength in the range from about 780 nm to about 860 nm.

12. The optoelectronic device of claim 1 wherein the optoelectronic device comprises a VCSEL that emits light at a wavelength in the range from about 1200 nm to about 1600 nm.

13. An optoelectronic device, comprising:
   an active region sandwiched between a first mirror and a second mirror, wherein the second mirror comprises a plurality of mirror period wherein said mirror periods comprise alternating layers of a first material having a first index of refraction and a second material having a second index of refraction with an interfacial transition layer between said first and second materials; and
   a tunnel junction formed in said second mirror for injecting holes into said active region.

14. The optoelectronic device of claim 13 wherein the second mirror is doped n-type.

15. The optoelectronic device of claim 13 wherein the first mirror is doped n-type.

16. The optoelectronic device of claim 13 wherein said first material comprises $Al_xGa_{1-x}As$ having a low index of refraction and wherein said second material comprises GaAs having a high index of refraction.

17. The optoelectronic device of claim 16 wherein said high index of refraction material comprises $Al_yGa_{1-y}As$ wherein y is less than 0.3.

18. The optoelectronic device of claim 17 wherein said interfacial transition layer comprises $Al_zGa_{1-z}As$.

19. The optoelectronic device of claim 18 wherein aluminum concentration ranges from about $0.27<z<0.33$.

20. The optoelectronic device of claim 13 wherein the active region comprises at least one quantum well.

21. The optoelectronic device of claim 20 wherein the one or more quantum wells comprise InGaAsN.

22. The optoelectronic device of claim 13 wherein said interfacial transition layer comprises a step graded semiconductor material.

23. The optoelectronic device of claim 22 wherein said step graded interfacial transition layer comprises a first transition layer comprising $Al_xGa_{1-x}As$ having a first concentration of Al and a second transition layer comprising $Al_yGa_{1-y}As$ having a second concentration of Al.

24. The optoelectronic device of claim 23 wherein said first concentration of Al ranges from about 5–15%.

25. The optoelectronic device of claim 23 wherein said concentration of Al ranges from about 5–15%.

26. A low resistance optoelectronic device, comprising:
   a distributed Bragg reflector comprising alternating layers of a first material having a first index of refraction and a second material having a second index of refraction semiconductor material with a step graded interfacial transition layer sandwiched between said first and second materials.

27. The low resistance optoelectronic device of claim 26 wherein said first material comprises AlGaAs having a low index of refraction.

28. The low resistance optoelectronic device of claim 26 wherein said step graded interfacial transition layer comprise a first transition layer comprising $Al_yGa_{1-y}As$ having a first concentration of Al and a second transition layer comprising $Al_yGa_{1-y}As$ having a second concentration of Al.

29. The low resistance optoelectronic device of claim 28 wherein said first concentration of Al ranges from about 5–15%.

30. The low resistance optoelectronic device of claim 28 wherein said second concentration of Al ranges from about 5–15%.

31. An optical subassembly comprising:
  an electrical package containing a VCSEL having at least one mirror period comprised of a plurality of mirror periods wherein at least a portion of said mirror periods comprise alternating layers of a first material having a first index of refraction and a second material having a second index of refraction with a step graded interfacial transition layers there between and a photodetector for monitoring power of the VCSEL; and
  a housing attached to the electrical package, the housing including a ferrule for aligning a fiber with an optical path light from the VCSEL.

32. The optoelectronic device of claim 31 wherein said alternating layers of said first material and said second material are doped n-type.

33. The optoelectronic device of claim 32 wherein said step graded interfacial transition layer is doped n-type and where concentration of dopant in said step graded interfacial transition layer is about 2–6 times greater than concentration of dopant in said alternating layers.

34. The optoelectronic device of claim 31 wherein said step graded interfacial transition layer comprises a first transition layer comprising $Al_xGa_{1-x}As$ having a first concentration of Al and a second transition layer comprising $Al_yGa_{1-y}As$ having a second concentration of Al.

35. The optoelectronic device of claim 34 wherein said first concentration of Al ranges from about 5–15%.

36. The optoelectronic device of claim 34 wherein said second concentration of Al ranges from about 15–25%.

* * * * *